United States Patent
Goldman et al.

(10) Patent No.: US 7,178,586 B2
(45) Date of Patent: Feb. 20, 2007

(54) FLATTENED TUBE COLD PLATE FOR LIQUID COOLING ELECTRICAL COMPONENTS

(75) Inventors: Richard D. Goldman, Stoughton, MA (US); Boris Akselband, Brighton, MA (US); Charles J. Gerbutavich, Salem, MA (US); John Franchina, Reading, MA (US)

(73) Assignee: Lytron, Inc., Woburn, MA (US)

( * ) Notice: Subject to any disclaimer, the term of this patent is extended or adjusted under 35 U.S.C. 154(b) by 0 days.

(21) Appl. No.: 10/195,840

(22) Filed: Jul. 15, 2002

(65) Prior Publication Data

US 2003/0010485 A1    Jan. 16, 2003

Related U.S. Application Data

(60) Provisional application No. 60/339,593, filed on Dec. 11, 2001, provisional application No. 60/305,479, filed on Jul. 13, 2001.

(51) Int. Cl.
- *F28F 1/00* (2006.01)
- *F28F 1/42* (2006.01)
- *B23P 15/26* (2006.01)

(52) U.S. Cl. .................. 165/177; 165/179; 165/173; 165/76; 165/80.4; 29/890.03; 29/890.046; 29/890.05

(58) Field of Classification Search .............. 165/80.4, 165/104.33, 184, 177, 179, 181, 173, 76, 165/78, 79; 29/890.03, 890.035, 890.045, 29/890.046, 890.049, 890.05; 228/183

See application file for complete search history.

(56) References Cited

U.S. PATENT DOCUMENTS

| | | | | |
|---|---|---|---|---|
| 4,694,898 A | * | 9/1987 | Clausen | 165/179 |
| 5,102,032 A | * | 4/1992 | Cottone et al. | 228/183 |
| 5,305,945 A | * | 4/1994 | Cottone et al. | 228/183 |
| 5,317,805 A | * | 6/1994 | Hoopman et al. | 29/890.03 |
| 5,453,911 A | * | 9/1995 | Wolgemuth et al. | 165/80.4 |
| 5,586,598 A | * | 12/1996 | Tanaka et al. | 165/177 |
| 5,826,646 A | * | 10/1998 | Bae et al. | 165/177 |
| 5,829,516 A | | 11/1998 | Lavochkin | 165/80.4 |
| 5,920,457 A | | 7/1999 | Lamb et al. | 361/699 |
| 5,983,997 A | * | 11/1999 | Hou | 165/80.4 |
| 6,065,208 A | | 5/2000 | Lamb et al. | 20/890.03 |

FOREIGN PATENT DOCUMENTS

DE    198 13 532    9/1999

(Continued)

*Primary Examiner*—Ljiljana Ciric
(74) *Attorney, Agent, or Firm*—Weingarten, Schurgin, Gagnebin & Lebovici LLP

(57) ABSTRACT

A cold plate and a method of forming the cold plate are provided that efficiently and cost effectively cools electrical components. The cold plate includes a flattened tube formed from a circular extruded tube to have a top surface and a bottom surface that are substantially parallel and contiguously connected by rounded corners and defining an interior space. The circular extruded tube includes a plurality of ins extending into the interior space form inner walls thereof to form a plurality of channels in said flattened tube between said fins for defining a cooling liquid passage therethrough. The fins may extend parallel to the direction that the flattened tube extends, or extend at a predetermined angle to the direction that the flattened tube extends. Also, the fins associated with the top surface may extend at an angle to the fins associated with the bottom surface to form a plurality of intersecting points which form a torturous fluid flow path.

13 Claims, 4 Drawing Sheets

FOREIGN PATENT DOCUMENTS

| | | | | |
|---|---|---|---|---|
| EP | 0132237 | * 1/1995 | ................ | 165/181 |
| FR | 2 748 800 A | 11/1997 | | |
| GB | 684830 | * 12/1952 | ................ | 165/184 |
| GB | 2 315 601 A | 2/1998 | | |
| JP | 404217791 | * 8/1992 | ................ | 165/184 |

* cited by examiner

FLATTENED TUBE COLD PLATE FOR LIQUID COOLING ELECTRICAL COMPONENTS

CROSS REFERENCE TO RELATED APPLICATIONS

This application claims priority under 35 U.S.C. §119(e) to provisional patent applications Ser. Nos. 60/305,479 filed Jul. 13, 2001; and 60/339,593 filed Dec. 11, 2001, the disclosures of which are hereby incorporated by reference.

BACKGROUND OF THE INVENTION

Electronic components mounted on circuit boards generate heat which must be dissipated for their proper functioning. In low total power or low power density applications, air is typically used to cool these electronic components. The use of fans, ducting and/or heatsinks to accomplish this is well understood and widely used in industry.

In high total power or high power density applications, air provides insufficient cooling because of its relatively low thermal capacity. In these applications, liquids can be used to provide significantly improved cooling, but provisions must be made to contain the liquid so that the electronic components are not directly contacted by the liquid.

One conventional technique for cooling electronic components uses a liquid-cooled plate. Conventional liquid-cooled cold plates are typically made of copper or aluminum, although other materials can be used. The cold plate includes channels within it for distributing the cooling liquid, and inlets and outlets for enabling the liquid to enter and exit the cold plate. The cold plate is then mated to the electronic circuit board. The electrical components on the circuit board that touch the cold plate are thereby cooled because of their close proximity to the cooling liquid, but at no time do the electrical components actually touch the cooling liquid directly.

There are a wide variety of cold plate technologies presently available. Lower performance cold plates typically use metal tubes to distribute the liquid and higher performance cold plates typically use vacuum braze construction. Vacuum brazing allows the use of high performance fins to be placed within the liquid channel at locations where better heat transfer is required by the cold plate surface.

In many applications there are just a few electronic components on a circuit board that actually require liquid cooling. The present invention provides for cost effective cooling for individual components as well as for entire circuit boards.

BRIEF SUMMARY OF THE INVENTION

The present invention is directed to providing a cold plate that efficiently and cost effectively cools electrical components. The present invention is accomplished according to one embodiment of the present invention by providing a flattened tube formed from a circular extruded tube to have a top surface and a bottom surface that are substantially parallel and contiguously connected by rounded corners and defining an interior space. The circular extruded tube includes a plurality of ins extending into the interior space form inner walls thereof to form a plurality of channels in said flattened tube between said fins for defining a cooling liquid passage therethrough. First and second header tubes are connected to opposite edges of the flattened tube for connecting the channels of the flattened tube. Thereby, an inlet and an outlet are provided for passing the cooling liquid through the channels. The circular extruded tube may be formed of copper so that water may be used as the cooling liquid without the need for any corrosion inhibitors.

In one embodiment of the present invention, the fins extend parallel to the direction that the flattened tube extends. Alternatively, the fins extend at a predetermined angle to the direction that the flattened tube extends. Furthermore, the fins associated with the top surface may extend at an angle to the fins associated with the bottom surface to form a plurality of intersecting points which form a torturous fluid flow path.

The present invention is further directed to a method of forming a cold plate for liquid cooling electrical components. The method includes the steps of extruding metal in a circular tube comprising a plurality of fins extending from the interior surface of the tube with the fins being equally spaced and of a predetermined height. Then, the circularly extruded tube is flattened so that a top surface and a bottom surface are substantially parallel and contiguously connected by rounded corners and the fins extend into the interior between the top and bottom surfaces. As a result, an a cost effective cold plate may be processed that efficiently cools electrical components associated therewith.

Other aspects, features and advantages of the present invention are disclosed in the detailed description that follows.

BRIEF DESCRIPTION OF THE SEVERAL VIEWS OF THE DRAWING

The invention will be more fully understood by reference to the following detailed description of the invention in conjunction with the drawings, of which.

DETAILED DESCRIPTION OF THE INVENTION

Figure 1A:
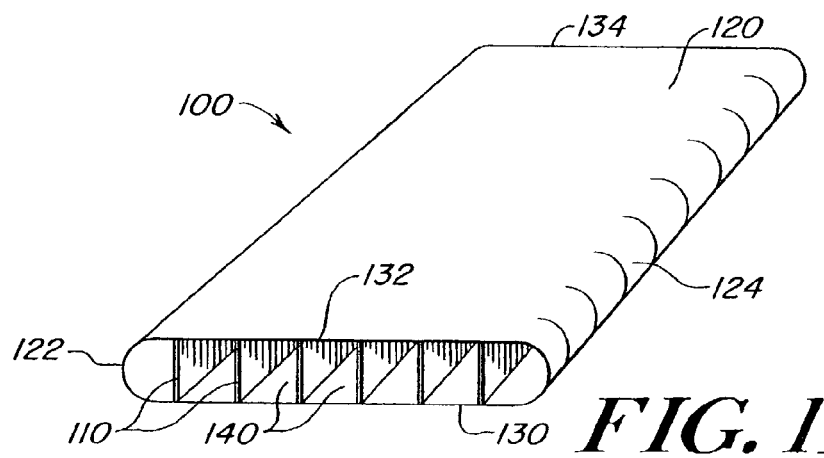
FIG. 1(a) illustrates a cold plate according to an embodiment of the present invention.
Figure 1B:
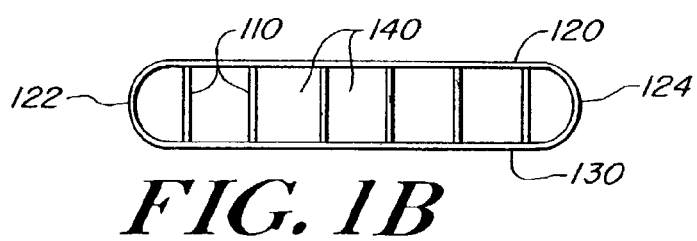
FIG. 1(b) illustrates a cross-section of the cold plate shown in FIG. 1.

A cold plate 100 for liquid cooling of electronic components according to an embodiment of the present invention is illustrated in FIGS. 1(a) and 1(b). The cold plate 100 includes a top surface 120 and a bottom surface 130 that are substantially parallel and contiguously connected by rounded corners 122 and 124. A plurality of fins 110 extend substantially perpendicular between the top and bottom surfaces to form a plurality of channels 140 through the length of the cold plate 100. The fins may extend straight or spiral/twist down the length of the tube in this embodiment.

In forming the cold plate 100, copper, aluminum or other like materials or compositions can be extruded into flattened tubes containing the plurality of fins 110. Because the cold plate 100 is formed from copper tubes, or other formable conductors, in an extrusion process, the manufacturing process is very cost effective. Also, the cold plate 100 of the present embodiment will have a thermal performance similar to cold plates formed of a vacuum-brazed process because the fins 110 are very thin walls. However, the cold plate 100 of the present embodiment is manufactured at a fraction of the cost of the vacuum-brazed cold plates. The flattened tube structure of the cold plate 100 is also extremely strong and can sustain internal pressures on the order of approximately 1000 psi or more. Furthermore, by bending the flattened tube structure around tight radiuses, the internal fins 110 act as spacers which prevents the tube from buckling and the passage from collapsing. Thereby, the cold plate 100 may be bent and shaped for placement in small and tight cooling areas. For instance, the cold plate 100 may be bent at a sharp radius and placed in an area near a motor to cool electrical components.

Figure 2A:
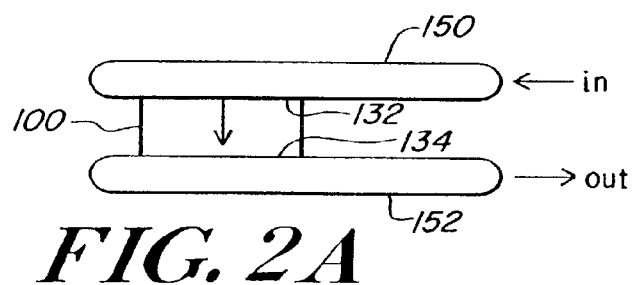
FIGS. 2(a) and 2(b) illustrate systems having multiple cold plates according to embodiments of the present invention.
Figure 2B:
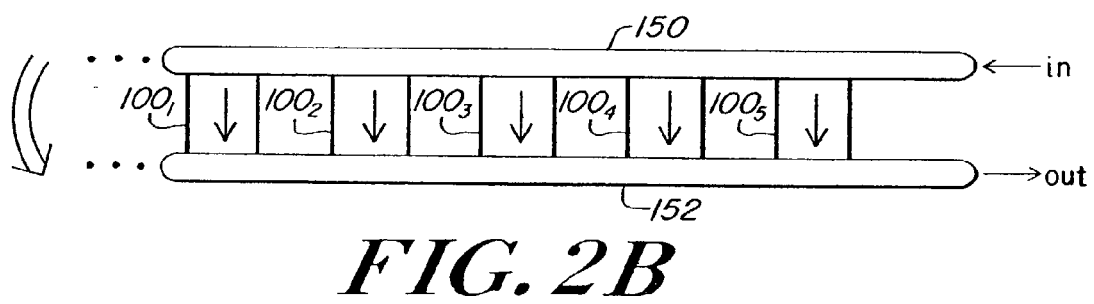

To provide inlets and outlets for cooling by circulating cooling liquid through the cold plate, header tubes 150 and 152 are connected as manifolds in the openings to the ends of the cold plate 100 as illustrated in the examples of FIGS. 2(*a*) and 2(*b*). At the ends 132 and 134 of the cold plate 100 which expose the fins 110 and channels 140, the header tubes 150 and 152 are attached by either gluing, soldering, brazing, welding or other known attaching techniques. In the embodiment of FIG. 2(*a*), one cold plate 100 is connected between the header tubes 150 and 152 and in the embodiment of FIG. 2(*b*), five cold plates $100_1$–$100_5$ are connected between the header tubes 150 and 152 with any more number possible.

Figure 3:
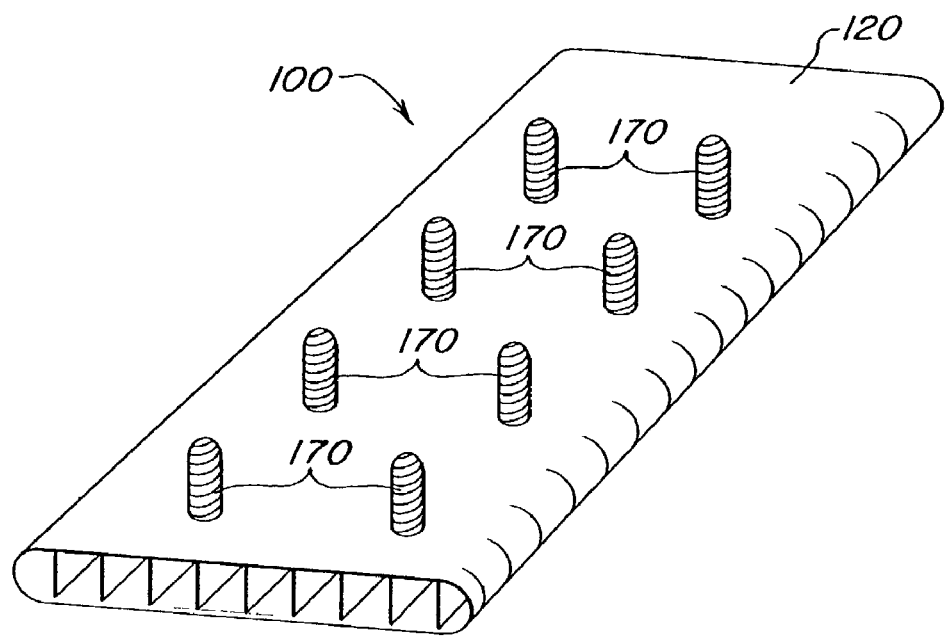
FIG. 3 illustrates the top surface of a cold plate having screw attachments for electrical components according to an embodiment of the present invention.

In one embodiment of the present invention, electrical components are directly attached to the top surface of the cold plate 100 by glue, epoxy or other known adhesives. In another embodiment of the present invention, screw attachments 170 are attached to the top surface of the cold plate 100 as illustrated in FIG. 3 so that the electrical components can be conveniently attached and removed as necessary. In the embodiment of FIG. 3, the screw attachments 170 are stud welded directly to the top surface of the cold plate 100 so that the electrical components have a receptacle for attachment and removal. The screw attachments 170 may be of aluminum, copper or other like materials and compositions.

The cold plate 100 may be formed of flattened tubes made in a variety of different widths. For instance, flattened tubes of widths ranging from 1.6 inches to 2.0 inches have been manufactured and shown to be of sufficient widths for many applications. However, it is possible to produce the cold plates 100 from flattened tubes having widths of 6 inches and greater if necessary.

The flattened tubes may be made from aluminum, copper, and like metals and composites. However, copper tubing is preferred over aluminum because of its advantageous characteristics such as better thermal conductivity than aluminum. Also, copper is a more suitable material when using water as a cooling fluid because aluminum corrodes in the presence of water. Furthermore, when aluminum is used as the metal for the flattened tube and water is used as the cooling liquid, well known and commercially available corrosion inhibitors, such as ethylene glycol mixtures, must be added to the water. Alternatively, well known and commercially available anti-corrosion fluids, such as hi-dielectric fluids, are used in place of the water/corrosion inhibitor mixtures in place of water. However, copper and other anti-water corrosive materials are desired to be used because of the greater thermal conductivity and wide availability of water. Also, when water is used as the cooling fluid, the fins 110 may be spaced further apart to provide wider channels 140 because water provides excellent heat transfer characteristics.

Figure 4A:
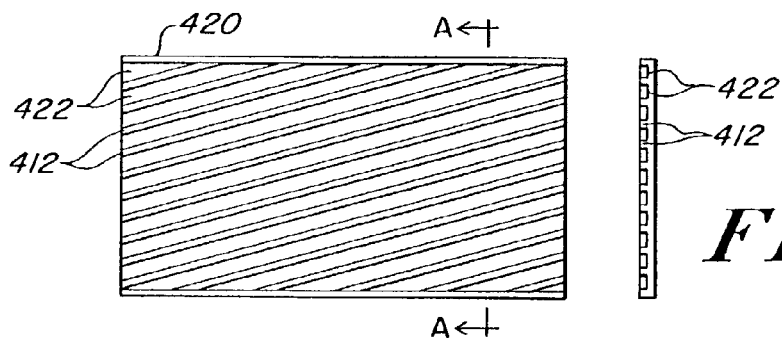
FIGS. 4(a) and 4(b) illustrate top and bottom sections of a cold plate having angled fins according to an embodiment of the present invention.
Figure 4B:
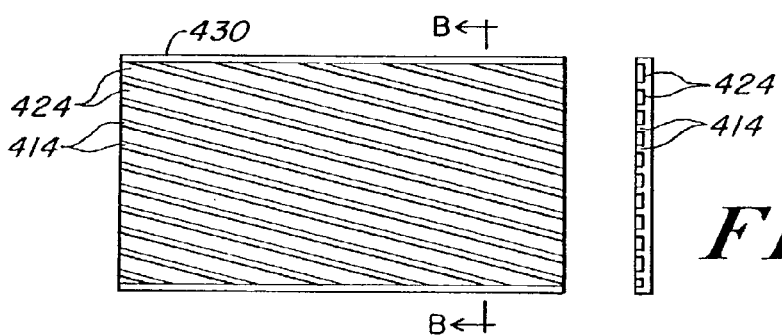
Figure 5A:
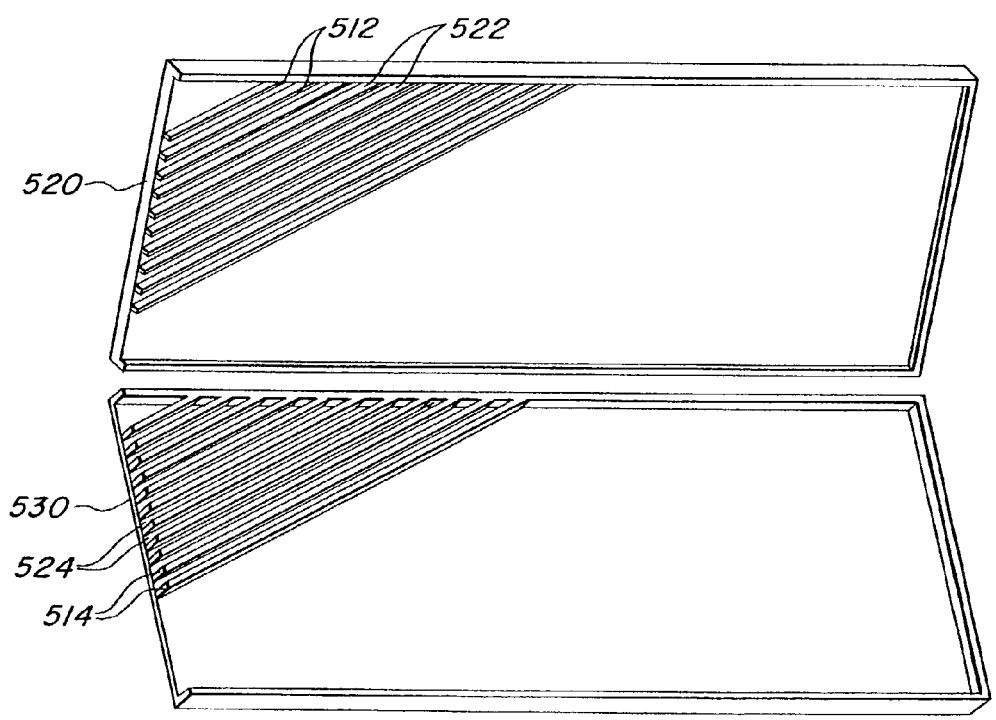
FIGS. 5(a) and 5(b) illustrate the intersection of the fins and an isometric view of these sections respectively according to an embodiment of the present invention.
Figure 5B:
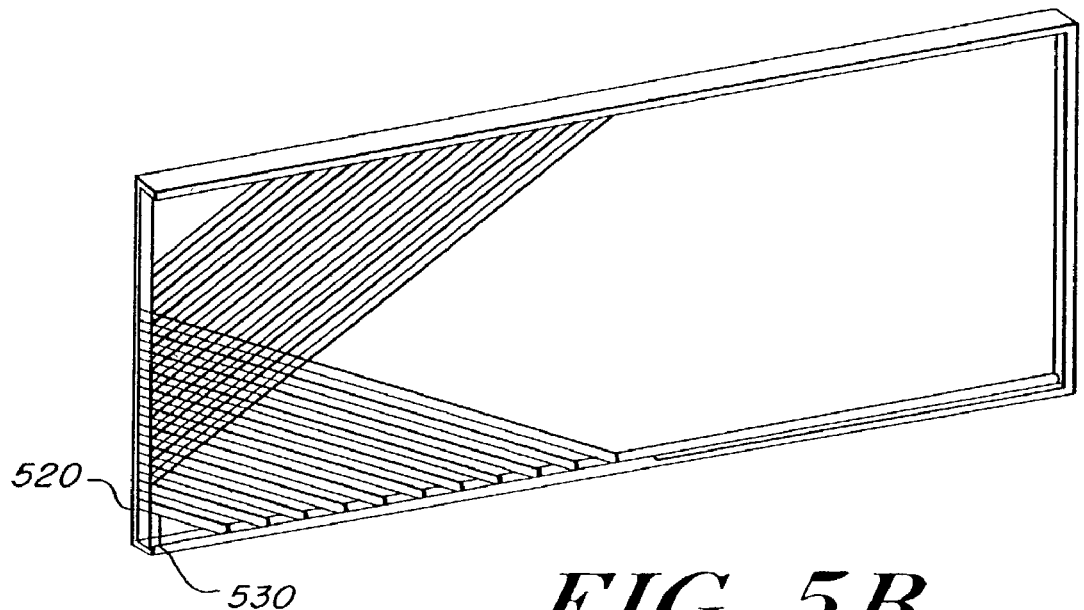

A high performance cold plate constructed from copper has a unique design in both the geometry of its flow passages and the manufacturing process used to produce the flow passages. FIGS. 4(*a*) and 4(*b*) illustrate an example of a top section and a bottom section 420 and 430 respectively of a cold plate having angled fins 412 and 414 according to an embodiment of the present invention. When the top and bottom sections are superimposed on one another, the angled fins cross one another and provide angled fluid flow paths through channels 422 and 424 which greatly enhances the heat transfer. FIG. 5(*a*) illustrates the geometry formed of the angled fins 512 and 514 on the top and bottom sections 520 and 530 respectively and FIG. 5(*b*) illustrates an isometric view of the internal passages of the cold plate according to the present embodiment. The thickness and length of the fins as well as the intersection angle of the fins may vary based on the desired application of the cold plate. Thereby, the walls of the fins may be easily tailored to be thin or thick, and spaced closely or widely depending on the particular application.

Figure 6:
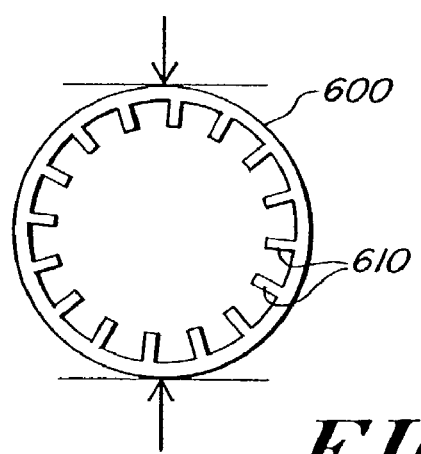
FIG. 6 illustrates a copper tube prior to post-processing according to an embodiment of the present invention.

The process used to produce the pattern of flow channels according to the present embodiment comprises post-processing a copper or other tube 600 with straight spiral fins 610 extruded down the length of the internal diameter. An exemplary cross section of the geometry of the copper tube 600 prior to any post-processing is illustrated in FIG. 6. The post-processing procedure includes the step of modifying the external shape for the copper tube 600 from its original diameter to a flat tube such that the fins 610 are in contact with each other at the crossing points. Such a modification can be achieved by extruding the tube 600 through one or more dies and/or by use of a clamping form 604 causing the tube 600 to flatten. A variety of methods for attaching the fins 610 to one another can be used to improve the pressure resistance of the flattened tube for the resulting cold plate. The attaching methods may include soldering, brazing and welding the fins 610.

Figure 7A:
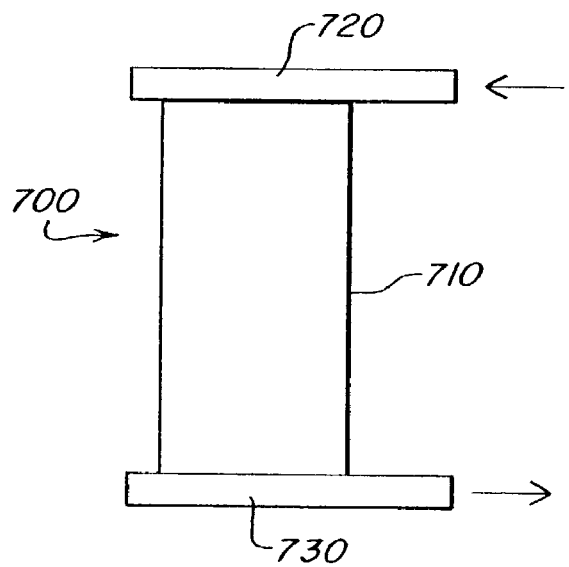
FIGS. 7(a) and 7(b) illustrate a cold plate system according to another embodiment of the present invention.
Figure 7B:
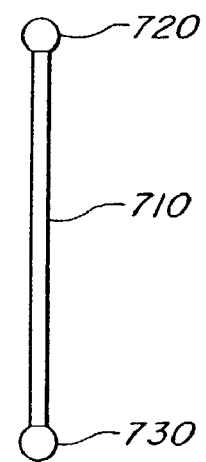

FIGS. 7(*a*) and 7(*b*) illustrates a completed cold plate system 700 according to an embodiment of the present invention with an inlet tube 720 and an outlet tube 730 brazed into opposite ends of the flattened tube 710 to provide a system for allowing the cooling liquid to flow in and out of the channels of the flattened tube 710. The cold plate may be also used for two phase fluid flow according to another embodiment of the present invention. For example, well known and commercially available refrigerants, such as R134a, can be used so that the fluid evaporates in the cold plate. Thereby, an even greater degree of cooling is achieved than can be effected with just a single phase liquid.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A cold plate for liquid cooling electrical components, comprising:
   a flattened tube formed from a circular extruded tube to have a top surface and a bottom surface that are substantially parallel and contiguously connected by rounded corners and defining an interior space, said flattened tube including:
   a plurality of fins extending into said interior space from the inner wall of said flattened tube to form a plurality of channels in said flattened tube therebetween for passing a cooling liquid therethrough,
   at least one of the surface and the bottom surface of said flattened tube comprises including at least one protruding screw attachment fixed directly to said at least one of the top surface and the bottom surface of said flattened tube for receiving at least one electrical component.

2. The cold plate according to claim 1, further comprising first and second header tubes connected to opposite edges of said flattened tube which connect to said plurality of channels and provide an inlet for said cooling liquid at said first header tube and an outlet for said cooling liquid after passing through said channels at said second header tube.

3. The cold plate according to claim 2, wherein a plurality of said flattened tubes are connected between said first and second header tubes.

4. The cold plate according to claim 1, wherein said flattened tube extends in a direction, and said fins extend parallel to said direction.

5. The cold plate according to claim 1, wherein said flattened tube extends in a direction and said fins extend at a predetermined angle to said direction.

6. The cold plate according to claim 5, wherein said plurality of tins comprises extruded fins spaced around said inner wall of said flattened tube.

7. The cold plate according to claim 1, wherein said fins associated with said top surface extend at an angle to the fins associated with said bottom surface forming a plurality of intersecting points to form a torturous fluid flow path.

8. The cold plate according to claim 1, wherein said flattened tube comprises copper.

9. The cold plate according to claim 1, wherein said cooling liquid comprises water.

10. The cold plate according to claim 1, wherein the at least one screw attachment is configured to allow the at least one electrical component attachable thereto and to be removable therefrom.

11. The cold plate according to claim 10, wherein each screw attachment comprises copper.

12. The cold plate according to claim 10, wherein each screw attachment comprises aluminum.

13. The cold plate according to claim 1, wherein said flattened tube comprises aluminum.

* * * * *

UNITED STATES PATENT AND TRADEMARK OFFICE
CERTIFICATE OF CORRECTION

PATENT NO. : 7,178,586 B2  Page 1 of 1
APPLICATION NO. : 10/195840
DATED : February 20, 2007
INVENTOR(S) : Richard D. Goldman et al.

It is certified that error appears in the above-identified patent and that said Letters Patent is hereby corrected as shown below:

Column 5, claim 1, line 13, "of the surface" should read --of the top surface--;

Column 5, claim 1, line 14, "tube comprises including" should read --tube including--;

Column 6, claim 6, line 5, "tins" should read --fins--; and

Column 6, claim 10, lines 20-21, "one electrical component attachable thereto and to be removable therefrom." should read --one electrical component to be both attachable thereto and removable therefrom.--.

Signed and Sealed this

Eighth Day of April, 2008

JON W. DUDAS
*Director of the United States Patent and Trademark Office*